United States Patent [19]
Zwarts

[11] Patent Number: 4,754,497
[45] Date of Patent: Jun. 28, 1988

[54] FM RECEIVERS USING THREE-TERMINAL NEGATIVE ADMITTANCE NETWORKS OR TWO AND THREE-TERMINAL NEGATIVE ADMITTANCE NETWORKS

[75] Inventor: Cornelis M. G. Zwarts, Gatineau, Canada

[73] Assignee: Canadian Patents and Development Limited, Ottawa, Canada

[21] Appl. No.: 851,553

[22] Filed: Apr. 14, 1986

[51] Int. Cl.$^4$ .............................................. H04B 1/26
[52] U.S. Cl. .................... 455/205; 455/208; 455/258; 455/333
[58] Field of Search ............... 455/205, 208, 258, 264, 455/318, 319, 324, 333; 333/216

[56] References Cited
U.S. PATENT DOCUMENTS 3,493,870  2/1970  Kupfer ................................ 455/333
4,184,120  1/1980  Teshirogi .......................... 455/333
4,525,186 11/1986  Zwarts ................................ 333/216
4,660,001  4/1987  Zwarts ................................ 333/216

Primary Examiner—Michael A. Masinick
Attorney, Agent, or Firm—Yoshiharu Toyooka

[57] ABSTRACT

Novel FM receivers are disclosed, which are very compact and simple yet possess high sensitivity. The receivers use novel three-terminal and two-terminal negative admittance networks. In one embodiment, one three-terminal negative admittance network forms a complete FM homodyne receiver. In another embodiment, two three-terminal negative admittance networks are used as the frequency converter and the demodulator and other functions of a superheterodyne receiver. In still another embodiment, a two-terminal negative admittance network is employed together with a three-terminal negative admittance network to form a complete superheterodyne FM receiver.

8 Claims, 9 Drawing Sheets

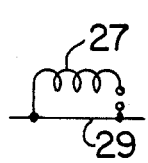
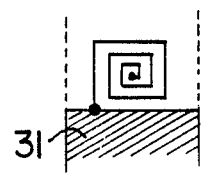
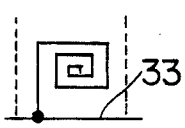
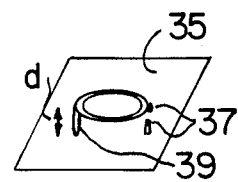
FIG.6a  FIG.6b  FIG.6c  FIG.6d
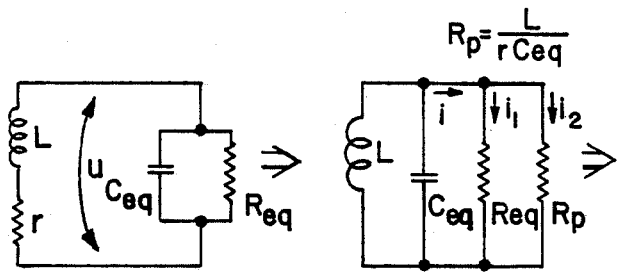
FIG.7a  FIG.7b  FIG.7c
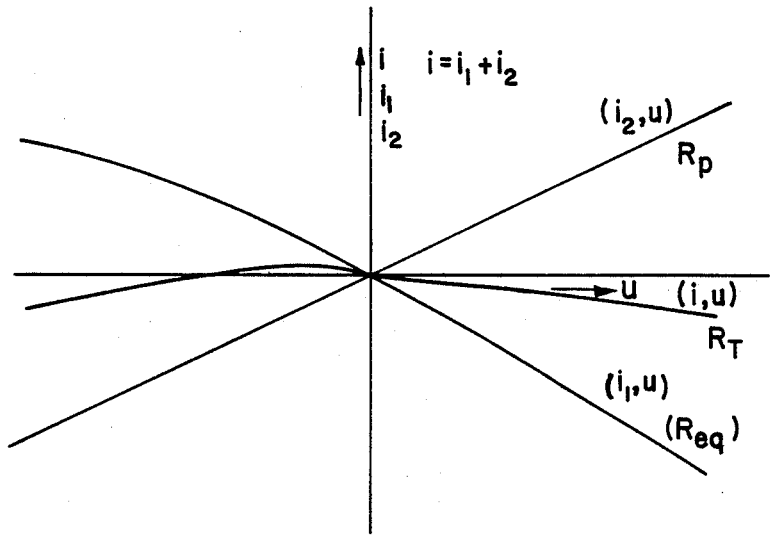
FIG.8

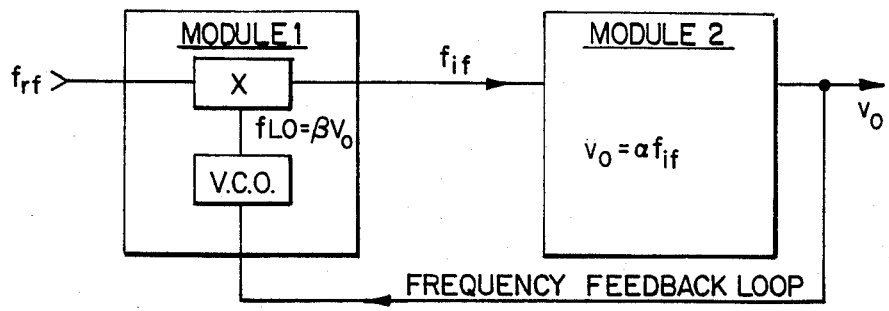
FIG. 22
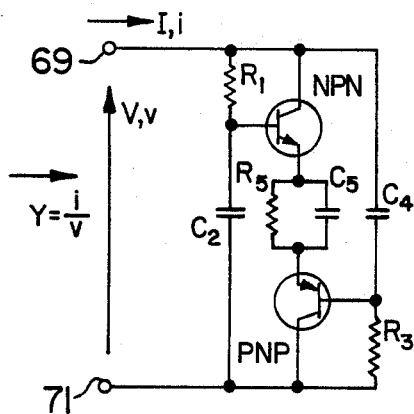
FIG. 23
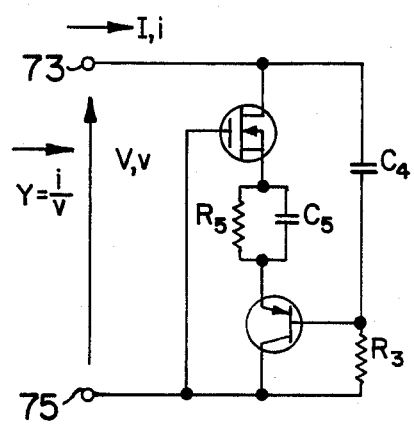
FIG. 24
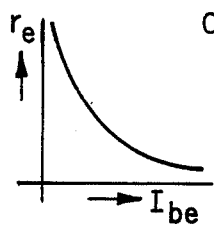 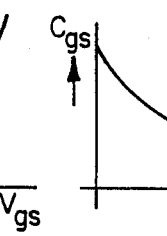 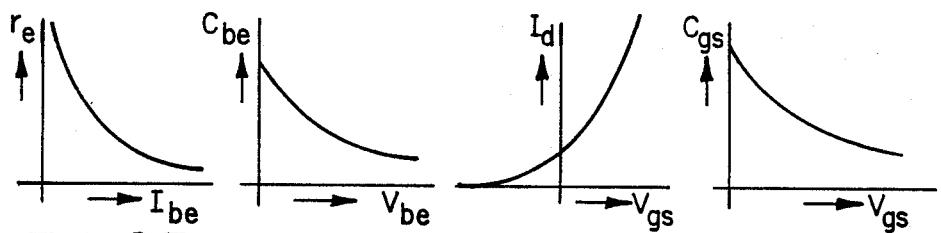
FIG. 25a  FIG. 25b  FIG. 25c  FIG. 25d

FM RECEIVERS USING THREE-TERMINAL NEGATIVE ADMITTANCE NETWORKS OR TWO AND THREE-TERMINAL NEGATIVE ADMITTANCE NETWORKS

The present invention relates to FM receivers and in particular is directed to very simple, compact FM receivers using negative admittance networks, such as two-terminal negative admittance networks and three-terminal negative admittance networks.

BACKGROUND OF THE PRESENT INVENTION

In the conventional approach to FM receivers typically one utilizes one separate electrical network for each function to be performed such as amplification, frequency mixing, frequency demodulation, etc. In the present invention, FM receivers include one or a small number of electrical networks, such as two terminal negative admittance networks and three-terminal negative admittance networks which perform multiple functions to form complete FM-receivers. The various functions performed simultaneously by the electrical networks are primarily based on particular features of the non-linear negative admittance of the networks.

In other U.S. patent applications, Ser. No. 725,999, entitled "Two-terminal negative admittance networks" and Ser. No. 725,998, entitled "Three-terminal negative admittance network", both filed on Apr. 22, 1985 by the inventor of the present application, (now U.S. Pat. No. 4,625,186 issued Nov. 25, 1986 and No. 4,660,001 issued Apr. 21, 1987, respectively) novel electrical networks comprising transistors are disclosed having two or three terminals and exhibiting a negative admittance.

It is also noted that another U.S. patent application Ser. No. 06/851,552 by the present inventor is filed concurrently with the present application and is directed to FM receivers using two-terminal negative admittance networks.

Although the disclosures of the above referenced applications are incorporated in the disclosure of the present application, it is felt that the present invention would be more readily understood, if brief descriptions of two-terminal and three-terminal negative admittance networks and FM receivers using two-terminal negative admittance network are included in this disclosure.

OBJECT OF THE INVENTION

It is therefore a principal object of the present invention to provide compact and simple FM receivers utilizing negative admittance networks.

It is another object of the present invention to provide FM homodyne receivers which employ a three-terminal negative admittance network.

It is still a further object of the present invention to provide FM superheterodyne receivers which use three-terminal negative admittance networks or both two and three terminal negative admittance networks.

SUMMARY OF THE INVENTION

Briefly stated, an homodyne FM receiver includes a three-terminal electrical network which has a first, a second, and a third terminal and exhibits a negative admittance to a high frequency input signal applied between the first and the third terminals. The three-terminal electrical network comprises a transistor having a first, a second and a third electrode, the first electrode connected to the first terminal and the second electrode coupled with the second terminal. Phase shift means bridge between the third electrode and the third terminal for phase shifting the current and the voltage of the high frequency input signal with respect to each other. The phase shift means are made of a phase shift resistor and a phase shift capacitor. The receiver further includes a coil or a transmission line resonance structure connected between the first and the third terminals so that an RF signal, induced in the coil, supplied the said high frequency RF input signal to the first terminal. A load resistor is connected at its one end to the second terminal and at the other end to one of the polarities of a power supply. A bypass capacitor is connected to the second terminal for bypassing the high frequency signal and an output terminal is coupled to the second terminal of the electrical network to provide a frequency demodulated output signal.

According to another aspect of the invention, a frequency converter comprises the homodyne FM receiver mentioned above in which a series resonance circuit is connected between the third electrode and the third terminal in parallel with the phase shift means and is adapted to resonate at the IF signal, whose frequency is lower than that of the RF input signal.

Additionally a decoupling transistor is provided between the second terminal and the one end of a parallel IF resonance circuit and an output terminal is connected to the decoupling transistor to provide an IF output signal whose frequency is equal the resonant frequency of the series and paralell resonance circuits.

According to still a further aspect of the present invention, a superheterodyne FM receiver comprises a frequency converter using either a two-terminal or three-terminal negative admittance network for converting a RF signal into an IF signal whose frequency is lower than that of the RF signal.

The superheterodyne FM receiver further includes the FM homodyne stage mentioned above using either a two-terminal or three-terminal negative admittance network operating now at the lower IF frequency of the IF signal. The FM homodyne stage is connected at the output of the frequency converter so that the demodulated FM signal is produced at the output terminal of the FM receiver.

The remaining of the disclosure consists of a brief description of the three-terminal negative admittance network followed by a detailed description of the implementation of homodyne and superheterodyne FM receivers using three-terminal negative admittance networks.

Furthermore a brief explanation will be given of the two-terminal negative admittance network followed by the description of the implementation of superheterodyne FM receivers using both two and three-terminal negative admittance networks.

BRIEF DESCRIPTION OF THE DRAWINGS

For a more complete understanding of the present invention and for further objects and advantages thereof, references may be made to the following description taken in conjunction with the accompanying drawings in which:

FIGS. 6(a), (b), (c), and (d) show schematically some antenna resonance "coils" which are used in the present invention.

FIGS. 7(a), (b) and (c) show a few equivalent circuits of the receiver shown in FIG. 4.

FIG. 8 indicates the current-voltage behaviour of various parameters shown in FIGS. 7(a), (b) and (c), FIGS. 9(a), (b) and (c) and 10(a), (b) and (c) are curves illustrating the behaviour of the oscillating tank circuit during build-up period and equilibrium respectively.

FIG. 22 illustrates the action of the external frequency feedback loop of a superheterodyne receiver.

FIG. 23 shows the preferred implementation of a two-terminal negative admittance for RF operation.

FIG. 24 shows the preferred implementation of a two-terminal negative admittance for the lower IF-frequencies.

FIGS. 25(a), (b), (c) and (d) are curves showing that the emitter-base capacitance $C_{be}$ and the emitter resistance $r_e$ of a transistor and also that the transductance and the source gate capacitance of a FET are non-linear.

BRIEF DESCRIPTION OF THREE-TERMINAL NEGATIVE ADMITTANCE NETWORK

Figure 1:
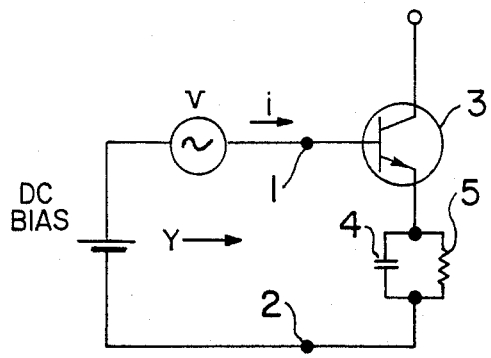
FIG. 1 is a basic simplified circuit diagram of the three-terminal negative admittance network.

The basic circuit to implement the three-terminal negative admittance is shown in FIG. 1. The admittance Y, looking into terminals 1 and 2 is $$Y = i/v = G + jB$$

Figure 2:
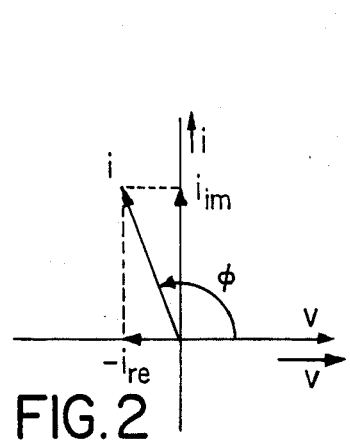
FIG. 2 is a graph showing the relationship between the current and voltage of the three-terminal negative admittance network.

The base bias voltage, of the network is slightly larger that the base-emitter voltage threshold and therefore a small current i flows through the transistor 3. The condition to make the small signal admittance Y negative at one particular frequency is shown in FIG. 2, that is, the current i should have a phase angle $\phi$ with respect to the input voltage v larger than 90°. This results in an out-of-phase component $i_{re}$ which translates into $$G = -i_{re}/v = \text{negative}$$

Figure 3A:
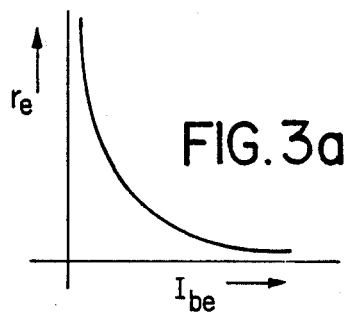
FIGS. 3(a) and (b) are curves showing that the emitter-base capacitance $C_{be}$ and the emitter resistance $r_e$ of a transistor are non-linear.
Figure 3B:
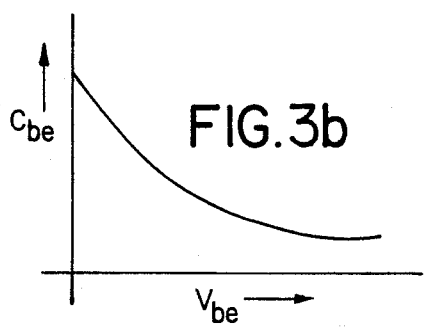

To obtain this condition, features are used which are normally considered to be limitations in the upper frequency response of bipolar junction transistors such as, interelectrode capacitances and charge carrier diffusion delay through the base region. Both of these cause a relative phase shift between the input voltage and the resulting input current. With an appropriate design of an external phase shift means made up with a capacitor 4 and a resistor 5, sufficient overall phase shift is obtained to create a negative conductance component in the admittance Y. The small signal negative admittance is non-linear. This is caused primarily by the non-linearity in the emitter resistance $r_e$ and the base-emitter capacitance $C_{be}$ of the transistor 3 as seen in FIGS. 3(a) and 3(b). The non-linearities are very essential in that they largely determine the behaviour of the negative admittance FM receiver.

Homodyne FM receiver using a three-terminal negative admittance network

Figure 4:
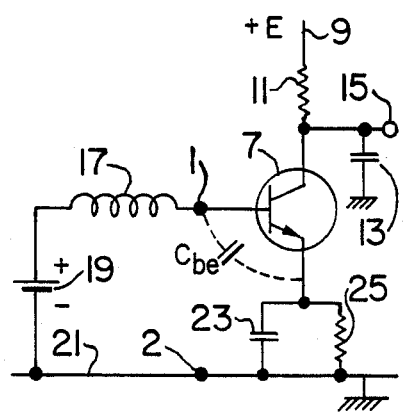
FIG. 4 is a circuit diagram of a FM homodyne receiver using a three-terminal negative admittance network.

Referring now to FIG. 4, there is shown a basic FM homodyne receiver circuit using a three-terminal negative admittance network. In the figure, a transistor 7, a bipolar junction or field effect transistor, is connected to a power supply at a terminal 9 through a load resistor 11. Capacitor 13 with resistor 11 form a low-pass filter which filters the RF signal and determines the bandwidth of the demodulated FM signal. The demodulated FM signal is available through terminal 15.

A coil 17 is provided as the input side of the transistor and a bias voltage 19 is also shown to apply proper bias potentials to the electrode of the transistor.

Figure 5A:
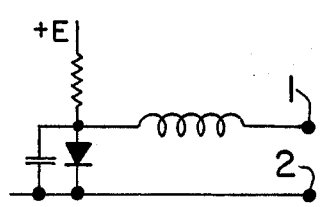
FIGS. 5(a) and (b) show various bias means.
Figure 5B:
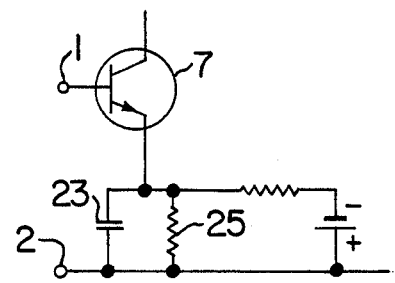

Bias means 19 is shown as a battery, to keep circuit diagrams simple. It is understood that the actual biasing can include resistors, diodes and RF bypass capacitors. A typical biasing scheme used is shown in FIG. 5(a). Another biasing scheme used provides bias on the emitter side of the transistor, as shown in FIG. 5(b).

The phase shift means are connected between one electrode of the transistor and the groundplane 21. The phase shift means are made up of a phase shift capacitor 23 and a phase shift resistor 25.

As evident in FIG. 4, a transistor 7 with three electrodes and a parallel connection of a capacitor 23 and a resistor 25 form a three terminal negative admittance network having a first terminal 1, a second terminal 2 and a third terminal at the collector of the transistor.

The homodyne receiver shown in FIG. 4 performs, unlike conventional receivers, all the functions needed for FM signal reception, such as functions of antenna, RF amplifier, local oscillator, mixer, limiter, synchronous FM discriminator, automatic frequency control, FM demodulator and audio amplifier. The various functions performed simultaneously by the negative admittance network are primarily based on particular features of the non-linear negative admittance.

This FM receiver is therefore extremely simple, uses very little electical power but has excellent sensitivity (when designed to operate in the FM broadcast frequency local FM stations are received very clearly). The receiver shown in the figure can be made to operate from the FM band (well into the UHF band. Unlike conventional FM receivers, the reception of the RF signal is synchronous resulting in a narrow RF bandwidth and a high rejection rate of adjacent signal channels.

A detailed description of these functions mentioned above will be given below under separate sub-headings.

Antenna

The receiver uses only one resonance tank circuit. It consists of an "external" inductor (or resonance structure) and the "internal" capacitors primarily consisting of the small interelectrode capacitances of the bipolar junction transistor 7 as reflected into the susceptance part of the negative admittance.

The RF signal coil 17 forms the external inductor of the resonance circuit and is optimized to be able to replace the function of a conventional antenna. This optimization calls for minimum capacitance in the tank circuit, therefore tuning capacitors are eliminated. Moreover the susceptance part of the admittance is minimized selecting high frequency transistors. For the same resonance frequency this allows one to increase considerably the inductance of the RF signal coil by increasing the number of turns and/or the diameter of the coil. This increase in number of turns and/or diameter allows to capture much more effectively the magnetic field component and hence to become effectively an inductive antenna. It was found that mounting the coil over a groundplane further increases its stability to operate as an antenna.

These "oversized" coils have wirelength which can be a considerable portion of the wavelength. It is therefore more appropriate to consider the coil as a helix transmission line mounted over a groundplane. For lower frequencies, one can use ferrite rods inside the helix transmission line to maintain reasonable small physical dimensions. Various resonance structures used are shown in FIGS. 6(a), (b), (c) and (d). In FIG. 6(a) is shown a helix transmission line 27 indicating a short helix transmission line over the groundplane 29 and the terminals at one end of the line and the groundplane. FIG. 6(b) and (c) show flat coils etched on printed circuit boards. The groundplane is designated by 31 and 33 and the terminals are shown by dots at the ends of the coils. For very high frequencies a new form of transmission line resonating structure has been developed. As shown in FIG. 6(d), it consists of a closed circular conductor mounted parallel to the groundplane 35 at a height d, shown in the figure, shorted at one point to the groundplane. The terminals are taken at 37 opposite to the shorting connection 39. This structure is particularly useful at frequencies approaching 1 GHz where its physical size becomes very attractive.

Local oscillator

Conventional oscillators use positive feedback to create and maintain oscillations in a resonance circuit. With a negative admittance, however, simply shunting across a suitable resonance circuit will generate and maintain oscillations if the power supplied by the negative conductance of the admittance, at the resonance frequency, is larger than the power dissipated in the resonance circuit. The inherent non-linearities in the negative admittance will result in a stable amplitude for the oscillations where power delivered and power dissipated are exactly equal.

The operation of the oscillator is illustrated with FIGS. 7(a), (b), (c), 8, 9(a), (b), (c) and 10(a), (b), (c). FIGS. 7(a), (b) and (c) give the equivalent circuit diagrams. In FIG. 7(a), U is a voltage generated across the resonance tank coil whose inductance is L and loss-resistance is r. The negative admittance network is reduced to the equivalent resistance $R_{eq}$ and capacitance $C_{eq}$. FIGS. 7(b) is a simplified version of FIG. 7(a) using an equation $$R_p = L/rC_{eq}$$

where $R_p$ is the loss-resistance of the circuit.

FIG. 7(b) is ultimately simplified to FIG. 7(c) where $R_T$ represents resultant resistance of $R_p$ and $R_{eq}$ and the current is indicated by i.

FIG. 8 shows the current voltage behaviour of $R_T$, $R_p$ and $R_{eq}$ plotted against voltage and current. In the figure, $i_1$ and $i_2$ and i represent the current flowing through $R_{eq}$, $R_p$ and $R_T$ respectively as indicated in FIGS. 7(b) and (c).

Figure 9A:
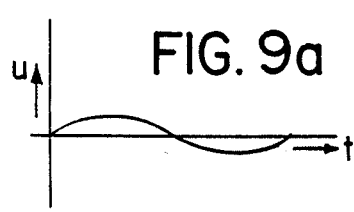

The resistance $R_T$ at i=0 and u=0 in FIG. 8 is negative. Therefore the circuit will start oscillating at the resonance frequency. The amplitude of oscillation will continue to increase until some equilibrium is reached. The build-up of the oscillation voltage and the stable equilibrium value reached are illustrated in FIGS. 9(a), (b), (c), and 10(a), (b), (c). The power dissipated in the resonance circuit over one cycle of oscillation is expressed by:

$$P = \int_0^T u(t)\, i(t)\, dt.$$

Figure 10A:
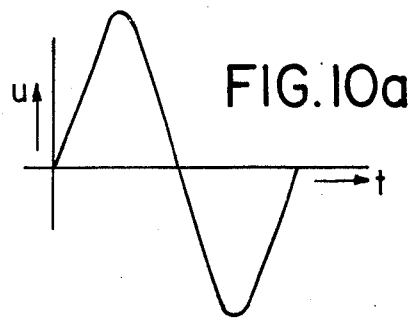
Figure 9B:
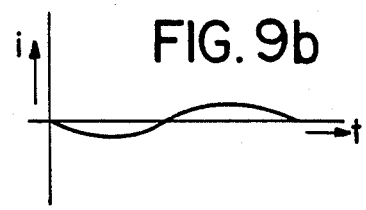
Figure 10B:
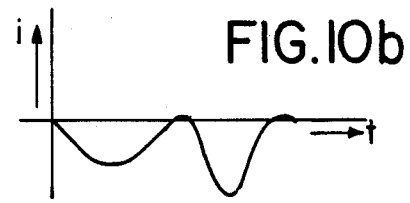
Figure 9C:
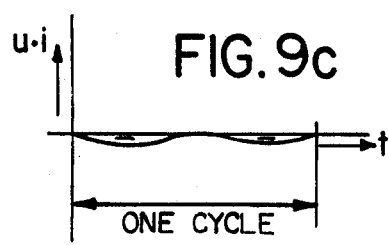
Figure 10C:
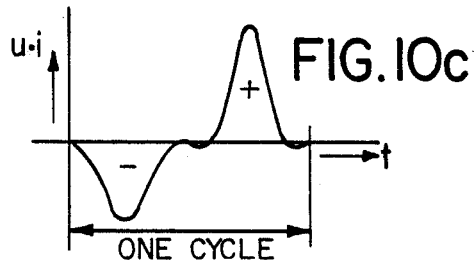

If P is positive, then power is dissipated, whereas if P is negative, power is supplied to the resonance circuit. In FIGS. 9(a), (b), (c), P is negative hence power is supplied and the amplitude of the oscillation continues to increase. In FIGS. 10(a), (b), (c), the equilibrium situation is reached, i.e. P=0, or during one cycyle, the power dissipated is exactly equal to the power delivered by the negative resistance. Graphically this means that the positive and negative surface area have become equal.

RF amplifier and Synchronous FM-Discriminator/Limiter

The RF-signal is captured by a tank circuit which in oscillating at its resonance frequency. It will be shown how, when the RF- and the LO- frequencies are very close, synchronization of the two signals occur.

Furthermore it will be shown how, effectively, amplification of the RF-signal is obtained. Moreover that, for certain conditions, the FM-modulation of the RF-signal not only results in a FM-modulation of the local oscillator due to synchronization, but also in a linear transfer of the FM-modulation of the RF-signal to AM-modulation of the oscillator signal, hence frequency discriminator action.

Also, the FM-to-AM conversion will be shown to be independent of the amplitude of the RF signal, therefore the equivalent action of a limiter is performed.

Therefore the analysis below will show how the equivalent functions of RF-amplifier, limiter and synchronous FM-discriminator are obtained with the basic circuit, shown in FIG. 4. First some basic relations will be derived, to be applied subsequently to analyze the RF-amplification and the synchronous FM discriminator/limiter action.

Referring back to FIGS. 4 and 7(a), (b), (c) where a basic FM homodyne receiver circuit and its equivalence are shown. Oscillations result due to a negative admittance looking into terminals 1 and 2 of FIG. 4.

Stable value of oscillation is the result of a suitable non-linearity of the conductance part of the negative admittance. The oscillating signal is rectified over the base-emitter junction and a corresponding averaged voltage is established over the emitter phase shift means 23, 25. The base emitter junction capacitance $C_{be}$ is voltage dependent and hence directly influenced by the amplitude of oscillation.

The negative admittance consists therefore of a non-linear conductance and a non-linear susceptance, both being a function of the amplitude of oscillation.

Figure 11:
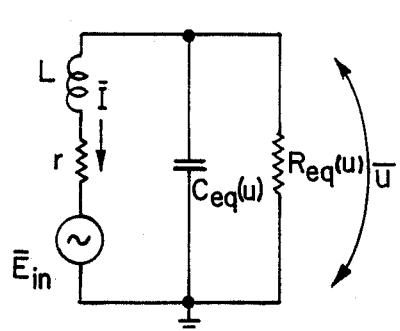
FIGS. 11 and 12 are small signal equivalent input circuits of a homodyne receiver.
Figure 12:
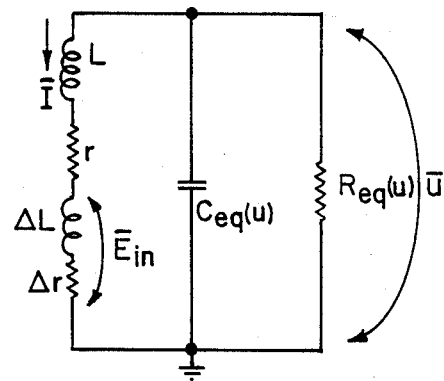

Now let us consider the small signal with a frequency equal or very close to the resonance frequency, being introduced into the oscillating network either by injection from a current source or induced by flux linkage from a remote transmitter. Both cases are equivalent to a samll voltage source $\overline{E}_{in}$ put in series with the resonance tank coil as shown in FIG. 11. In the figure, the resonant $\overline{U}$, current $\overline{I}$ and induced signal voltage $\overline{E}_{in}$ are shown. It is assumed that $|\overline{E}_{in}| << |\overline{U}|$. The current $\overline{I}$ through the inductor L can then be considered constant and independent of the voltage source $\overline{E}_{in}$. This assumption allows us to replace the voltage source $\overline{E}_{in}$ by a small fictitious complex impedance $\overline{Z}$ which will be given by:

$$\overline{Z} = \Delta r + j\omega_0 \Delta L = \overline{E}_{in}/\overline{I}$$

using small disturbances $\Delta L$ and $\Delta r$ of inductance L and resistance r respectively. If $\overline{Z}$ is chosen equal to $$\overline{Z} = \overline{E}_{in}/\overline{I},$$

then FIGS. 11 and 12 are equivalent. The equivalent model of FIG. 12 permits us to analyze the relationship between both frequency and amplitude of the oscillation as a function of the induced voltage in terms of a small disturbance of the inductance by a small impedance.

In FIG. 12, the following symbols are used:

$$\overline{I} = I e^{j\omega_0' t}$$

$$\overline{E}_{in} = E_{in} e^{j(\omega_1 t + \psi)}$$

$$\overline{U} = U e^{j(\omega_0' t + \pi/2)}$$

$$\overline{Z} = \Delta r + j\omega_0 \Delta L = \overline{E}_{in}/\overline{I}$$

where
- $\omega_1$ = frequency of induced signal $\overline{E}_{in}$
- $\omega_0$ = undisturbed resonance frequency of oscillator
- $\omega_0'$ = instantaneous frequency of oscillator
- $(\omega_1 - \omega_0)$ = difference in frequency between $\overline{E}_{in}$ and undisturbed frequency of oscillator
- $(\omega_0' - \omega_0)$ = change is oscillator frequency due to induced signal
- $(\omega_1 - \omega_0')$ = instantaneous beat frequency between oscillator an injected signal
- $\psi$ = instantaneous phase angle between current $\overline{I}$ and voltage $\overline{E}_{in}$.

The differential equation relating $\overline{E}_{in}$ and $\overline{I}$ is $$d\psi/dt = (\omega_1 - \omega_0')$$

$d\psi/dt$ represents the instantaneous beat frequency. To simplify the analysis it is assumed that synchronization between induced signal $E_{in}$ and oscillator signal U has occured. Therefore $d\psi/dt = 0$ or $\psi$ = constant and $\omega = \omega_0'$. The frequency $\omega_0$ and the amplitude U of oscillation are non-linear functions of r and L. For small variations around operating points $\omega_0$ and $U_0$, one can linearize these relations using expansion in Taylor series for a function of two variables and retaining only the first order terms.

$$U = U_0 + \Delta r \frac{\partial U}{\partial r} + \omega_0 \Delta L \frac{1}{\omega_0} \frac{\partial U}{\partial L} \quad (1)$$

$$\omega_0' = \omega_0 + \Delta r \frac{\partial \omega_0}{\partial r} + \omega_0 \Delta L \frac{1}{\omega_0} \frac{\partial \omega_0}{\partial L} \quad (2)$$

Let us consider now $$\frac{\partial U}{\partial r} \text{ and } \frac{1}{\omega_0} \frac{\partial U}{\partial L}$$

as the components of a vector $\overline{A}$ at angle $\alpha$ and $$\frac{\partial \omega_0}{\partial r} \text{ and } \frac{1}{\omega_0} \frac{1}{\partial L}$$

as the components of a vector $\overline{F}$ at angle $\beta$, then $$\frac{\partial U}{\partial r} = A \cos\alpha; \quad \frac{1}{\omega_0} \frac{\partial U}{\partial L} = A \sin\alpha$$

$$\frac{\partial \omega_0}{\partial L} = F\cos\beta; \quad \frac{1}{\omega_0} \frac{\partial \omega_0}{\partial L} = F \sin\beta$$

Meanwhile, the fictitious impedance $\overline{Z}$ is defined as $$\overline{Z} = \frac{\overline{E}_{in}}{\overline{I}} = \frac{E_{in}}{I} e^{j(\omega_1 t - \omega_0' t + \psi)}$$

where $\psi$ is a phase angle between $\overline{E}_{in}$ and $\overline{I}$.
Signals are synchronized, hence $\omega_1 = \omega_0'$, thus $$\overline{Z} = \frac{E_{in}}{I} e^{j\psi} = \left(\frac{E_{in}}{I} \cos\psi\right) + j\left(\frac{E_{in}}{I} \sin\psi\right)$$

Because $\overline{Z} = \Delta r + j\omega_0 \Delta L$, it follows:

$$\Delta r = \frac{E_{in}}{I} \cos\psi$$

$$\omega_0 \Delta L = \frac{E_{in}}{I} \sin\psi$$

Consequently equations (1) and (2) can be written into $$(U - U_o) = \frac{E_{in}}{I} A \cos(\psi - \alpha) \quad (3)$$

$$(\omega_o' - \omega_o) = \frac{E_{in}}{I} F \cos(\psi - \beta) \quad (4)$$

Relationships (3) and (4) will be used to analyze the functions of RF-amplifier and Synchronous FM discriminator.

RF-amplifier

The RF signal is induced into a circuit which is oscillating at the frequency of the RF-signal (signals are synchronized). The RF gain is defined as the charge, $\Delta U = U_0 - U$, in the amplitude brought about by the induced RF-signal, $E_{in}$. From equation (3) above, the RF-gain is expressed, $$RF \text{ gain} = \frac{U - U_o}{E_{in}} = \frac{A}{I} \cos(\psi - \alpha)$$

Optimum RF gain is obtained for minimum I and maximum A.

Various ways of optimizing RF gain are discussed below:

"I" It is obvious that I can be reduced by decreasing U, the amplitude of oscillation, since I is directly proportional to U. The current I is also reduced by decreasing $C_{eq}$ as much as possible, allowing the inductance L to increase, keeping the resonance frequency constant. The impedance $\omega_0 L$ is hence maximum and for a given U, minimum current I flows through the inductance L.

"A" Vector $\overline{A}$ is composed of two vector components $\partial U/\partial r$ and $$\frac{1}{\omega_o} \frac{\partial U}{\partial L}$$

A is:

$$A = \left\{ \left( \frac{\partial U}{\partial r} \right)^2 + \left( \frac{1}{\omega_o} \frac{\partial U}{\partial L} \right)^2 \right\}^{\frac{1}{2}}$$

To minimize I, L is maximized, therefore minimizing $$\frac{1}{\omega_o} \frac{\partial U}{\partial L}.$$

Hence to maximize A, one is left with $\partial U/\partial r$ which should be made as large as possible. This is obtained by striving for the oscillation to be very marginal, i.e. keeping the non-linearity in the negative conductance $1/R_{eq}$ small and smooth as possible. Any resistive disturbance, $\Delta r$, will then result in a large shift in the amplitude of the oscillation. This can be seen readily from an inspection of FIGS. 8, 10(a), (b), (c).

Making $$\frac{1}{\omega_o} \frac{\partial U}{\partial L}$$

very small and $\partial U/\partial r$ very large yields for $\alpha$:

$$tg\alpha = \left( \frac{1}{\omega_o} \frac{\partial U}{\partial L} / \frac{\partial U}{\partial r} \right) \approx 0$$

therefore $\alpha = \pi$, it follows that $\cos(\psi - \alpha) = \cos(\psi - \pi) = -\cos \psi$.

The RF gain, and hence the sensitivity, of the receiver is thus optimized with L large, $C_{eq}$ and U small and furthermore keeping the oscillator very marginal, i.e. reducing the non-linearity in the negative admittance to a minimum.

Synchronous FM discriminator/limiter

Three basic requirements are implicit in the operation of a limiter and a synchronous FM discriminator:
(1) Limiter keeps the output signal constant independent of the induced RF signal.
(2) Synchronization between RF signal and local oscillator signal
(3) Linear conversion from FM to AM modulation.

The synchronization has been analyzed above and resulted in relationship expressed by equation (4). The maximum values for $\cos(\omega - \beta)$ are $\pm 1$. The maximum range over which synchronization can take place is therefore $$\pm I \frac{E_{in}}{I} F(Hz)$$

Notice from the expression above that this range is directly proportional to the amplitude, $E_{in}$, of the induced RF signal and inversely proportional to the current I, and hence U, the amplitude of the oscillation. To analyze the limiter action and the linear conversion of FM and AM modulation we will need both relationships equation (3) and (4). Eliminating $\psi$ from the both equations gives the relationship.

$$\cos^{-1}\left\{ (\omega_o' - \omega_o) \frac{I}{E_{in}F} \right\} - \quad (5)$$

$$\cos^{-1}\left\{ (U - U_o) \frac{I}{E_{in}A} \right\} = (\alpha - \beta)$$

One can see from the above equation that the change in amplitude of the oscillator $(U - U_0)$, is an implicit non-linear function of both the input frequency change, $(\omega_1 - \omega_0) = (\omega_o' - \omega_0)$ and the amplitude, $E_{in}$, of the induced signal.

Hence, the two basic requirements for a FM discriminator/limiter, i.e. linear FM to AM conversion and conversion independent of input amplitude, are not satisfied, in general. There are however two specific falues for $(\alpha - \beta)$, for which the above requirements are met and they are $(\alpha - \beta) = 0$ and $(\alpha - \beta) = \pi$ rad. In these cases equation (5) above becomes:

$$U - U_o = \frac{A}{F} (\omega_o' - \omega_o) \text{ when } (\alpha - \beta) = 0 \text{ rad.}$$

$$U - U_o = -\frac{A}{F} (\omega_o' - \omega_o) \text{ when } (\alpha - \beta) = \pi \text{ rad}$$

Figure 13:
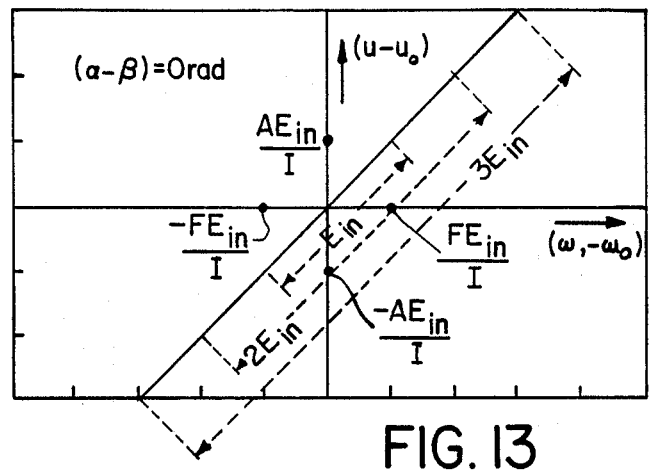
FIGS. 13 and 14 show graphs indicating relationships of output signal amplitudes and input frequencies under certain conditions.
Figure 14:
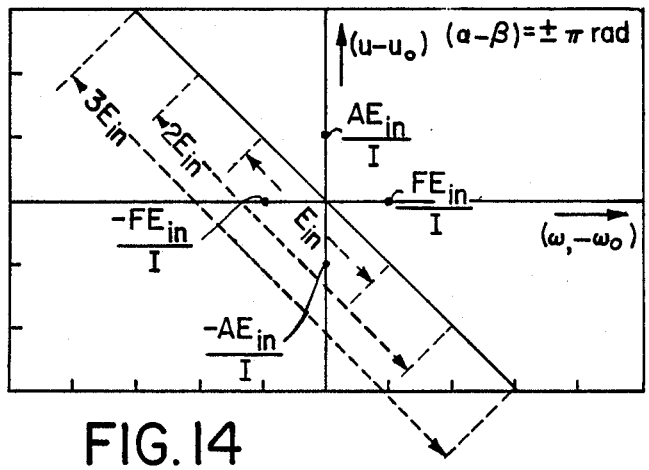

These relations are shown in FIGS. 13 and 14.

It is shown previously that $\alpha = \pi$. Hence linear conversion from FM and AM modulation is obtained for $\beta = 0$ or $\beta = \pi$. To show how this condition can be attained we have to look at relationships derived above:

$$\frac{\partial \omega_o}{\partial r} = F \cos\beta \quad \frac{1}{\omega_o} \frac{\partial \omega}{\partial L} = F \sin\beta$$

Combining the above equations gives $$tg\beta = \frac{1}{\omega_o} \frac{\partial \omega_o}{\partial L} / \frac{\partial \omega_o}{\partial r}$$

Imposing $\beta = 0, \pi$ requires $$\frac{1}{\omega_o} \frac{\partial \omega_o}{\partial L} << \frac{\partial \omega_o}{\partial r} \qquad (6)$$

(For conventional feedback type of oscillators the above condition (6) is not satisfied, in effect the opposite is true.)

As explained earlier, the oscillator is very marginal, i.e. $\partial U/\partial r$ is very large. Hence any change $\Delta r$ results in a large variation in U.

As can be seen from FIG. 4, the amplitude U of oscillation is rectified through the base-emitter diode junction and averaged by the phase shift network of resistor 25 and capacitor 23. The resulting average voltage at the emitter is proportional to the amplitude of oscillation. The base-emitter junction capacitance, $C_{be}$, is voltage dependent and therefore directly influenced by the voltage over the emitter network. A change in the amplitude of oscillation leads immediately via the capacitance $C_{be}$, to a large change in the frequency of oscillation, $\omega_0$, in other words, $\partial \omega_o/\partial r$ is very large and is effectively much larger than $$\frac{1}{\omega_0} \frac{\partial \omega_0}{\partial L},$$

therefore satisfying the condition expressed by equation 6.

An increase in r decreases U, resulting in a larger $C_{be}$, therefore decreasing $\omega_0$, hence $\partial \omega_0/\partial r$ is large and negative;

$$\frac{1}{\omega_0} \frac{\partial \omega_0}{\partial L}$$

is small and negative. Therefore the angle $\beta$ is almost equal to $\pi$, hence: $(\alpha - \beta) = 0$ thus $$(U - U_0) = \frac{A}{F} (\omega_0' - \omega_0) \qquad (7)$$

Several important features follow from relation (7) above.

(1) Relation (7) shows clearly that a change in frequency is converted linearly into a corresponding amplitude change, hence a linear conversion from FM to AM modulation.

(2) The conversion gain factor A/F, is only a function of circuit parameters, independent therefore of the amplitude of both the injected signal and the oscillator signal. Therefore one has the equivalent of a limiter, hence AM rejection.

Figure 15:
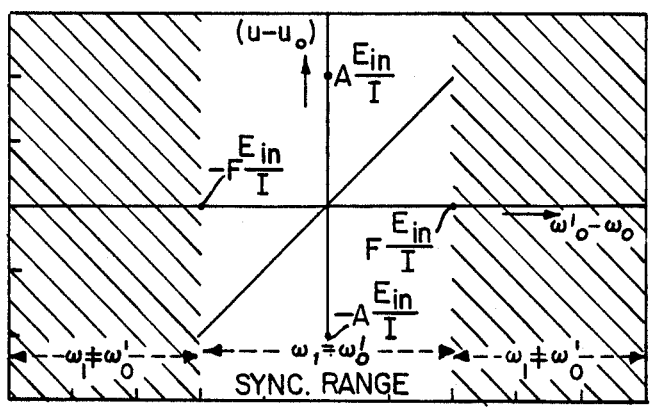
FIG. 15 shows graphically the operation of the synchronous FM discriminator and limiter action of the receiver.

Relation (7) is shown graphically in FIG. 15. Whereas the conversion gain A/F and hence the slope in FIG. 15 is independent of both the amplitude $E_{in}$ of induced RF signal and the amplitude of oscillation, one notices, as shown, that the range of synchronization depends both on the amplitude of induced signal $E_{in}$ and the amplitude $U = I\omega_0 L$, of oscillation.

The RF and local oscillation frequencies are synchronized inside the synchronization range. The function of automatic frequency control of conventional FM receivers is therefore performed automatically.

Mixer

The function of a mixer, in a receiver, is to down-convert the frequency of the RF-signal to a more convenient lower, as it is commonly in superheterodyne receivers.

In a homodyne type receiver, however, the RF signal has the same frequency as the local oscillator and therefore the beat signal is at DC. The basic requirement of a mixer is to have a non-linear behaviour so as to be able to produce the beat frequency. In the present invention, the function of the mixer is provided by the non-linear behaviour of the negative admittance of the transistor, made up of the emitter resistance, $r_e$ and the base-emitter junction capacitance, $C_{be}$, as illustrated in FIG. 3.

Demodulator

As was explained above in connection with RF amplifier and synchronous FM discriminator/limiter, there is a linear conversion obtained from the FM modulation of the input RF-signal to AM modulation of the local oscillator signal. The AM modulation of the local oscillator signal however has to be demodulated to obtain a base-band output signal.

The demodulator function is performed by the rectifying action of the base-emitter diode junction. The smoothing action to eliminate the high frequency signals is performed by the low-pass filtering of the phase shift emitter network.

Audio amplifier

Figure 16:
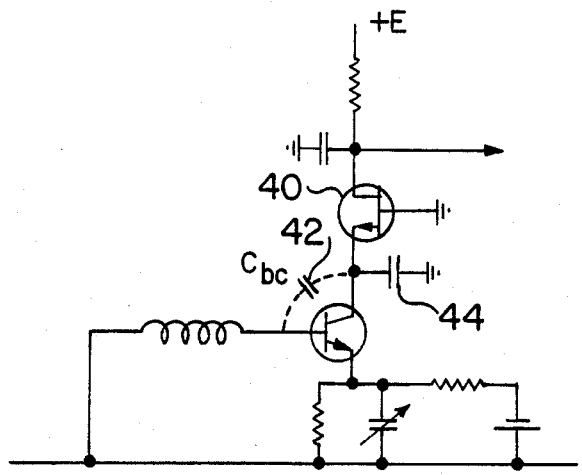
FIG. 16 is another embodiment of a FM homodyne receiver.

Referring to FIG. 4, the demodulated FM signal at the emitter can be amplified using the transistor 7 also as an audio amplifier. The gain is approximately equal to the ratio of resistor 11 to resistor 25. The bypass capacitor 13 can be chosen to give the desired low-pass bandwidth. Since typically, resistor 25 is quite small, around 2K$\Omega$, considerable audio amplification is possible. If however, a large gain is incorporated and the DC operating voltage on the oscillator is low then a transistor or FET should be used to decouple the collector to stabilize the operation. This circuit arrangement, using a JFET 40 as a stabilizing transistor, is shown in FIG. 16. This arrangement prevents the voltage dependent collector-base junction capacitance 42 to operate in a positive frequency feedback scheme having enough gain to cause low frequency oscillations in the output. A small RF-bypass capacitor 44 further improves the performance of the receiver.

Superheterodyne FM receiver using three-terminal negative admittance networks The sensitivity of the homodyne receiver can be substantially improved by using negative admittance circuits to implement a superheterodyne type of FM receiver.

This permits signal amplification of the signal at the intermediate frequency before it is presented to the homodyne receiving stage, which is now operating at this intermediate frequency.

Figure 17:
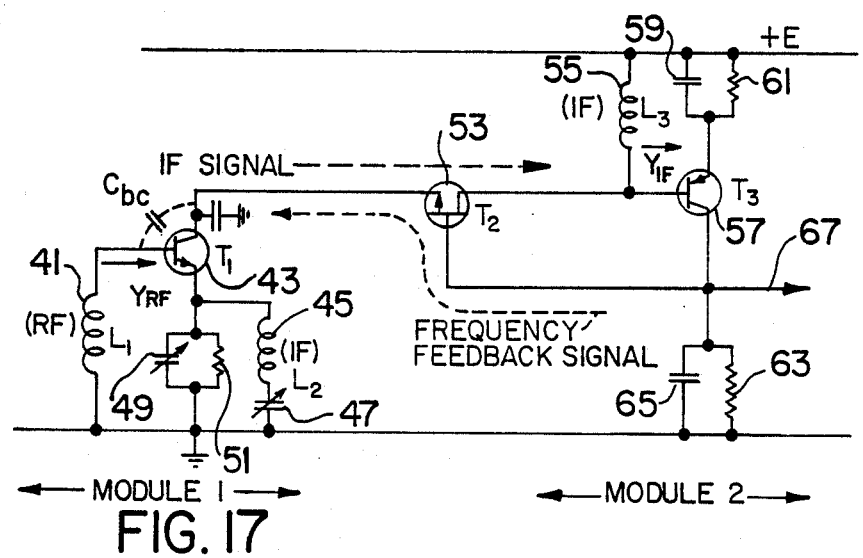
FIG. 17 is a simplified circuit diagram of a superheterodyne FM receiver according to the present invention.
Figure 18:
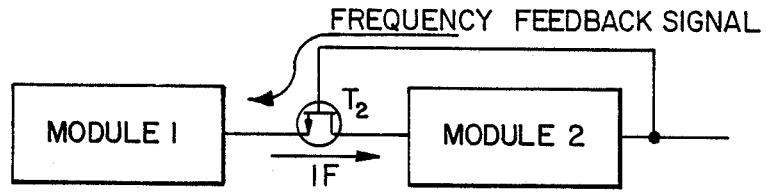
FIG. 18 illustrates the linking of the two modules of a superheterodyne FM receiver, in both directions, by a coupling transistor $T_2$.

The simplified circuit diagram of the negative admittance superheterodyne receiver, with DC-biasing details omitted, is shown in FIG. 17. It can be separated into two functional modules which are linked together by transistor $T_2$, as shown in FIG. 18.

The function performed by these two modules are:

module 1: Antenna, RF-amplifier, RF local oscillator, RF-mixer and IF-amplifier module 2: If local oscillator, IF-mixer, synchronous frequency discriminator with AM-rejection and audio amplifier.

Module 1 and 2 are further linked by a: frequency-feedback-loop.

Also note that for the analysis of the IF-amplifier, one has to consider both module 1 and module 2, due to the close integration of these modules.

Module 2 operates as the homodyne FM receiver, however it now operates on the IF beat frequency produced by module 1.

Transistor 43 with three electrodes and a parallel connection of a phase shift capacitor 49 and a phase shift resistor 51, form a first three terminal negative admittance network having a first, a second and a third terminal. Transistor 57 with three electrodes and a parallel connection of a phase shift capacitor 59 and a phase shift resistor 61 form a second three-terminal negative admittance network having a fourth, a fifth and a sixth terminal. Note the location of phase shift capacitors and resistors in the first and second three terminal networks. The difference is due to the type of each transistor, PNP or NPN.

The operation of the homodyne FM receiver has been described in detail above; we retain here only that it synchronises with the IF signal and that is produces a linear conversion from frequency to amplitude modulation.

Figure 19:
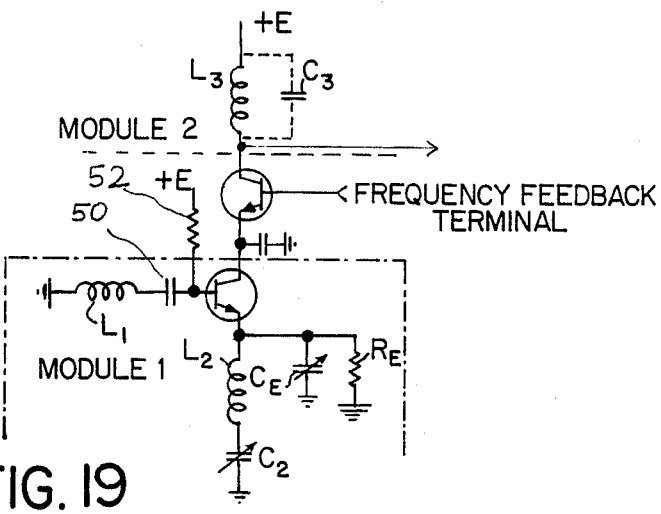
FIG. 19 is a circuit diagram of a frequency converter.

Module 1, also referred to as "frequency converter", is shown in FIG. 19. In this figure, a DC biasing is performed by a DC blocking capacitor 50 and a bias resistor 52. The tank circuit $L_3 C_3$ in FIG. 19 is essential in both modules. In module 1 it is part of the local oscillator and other functions of the homodyne receiver stage. In module 2 it forms a parallel IF resonance circuit allowing amplification of the IF signal to be obtained.

The functions of mudule 1, such as antenna, oscillator and mixer, are essentially as described for the homodyne receiver. With regard to the mixer, the difference however is that the beat frequency is not taken at zero Hz but at a certain IF frequency.

Two new functions are RF-amplifier and IF-amplifier. Also there is a frequency-feedback-loop, which results in a substantial compression of the signal bandwidth. These functions will be described next.

RF amplifier

Figure 20:
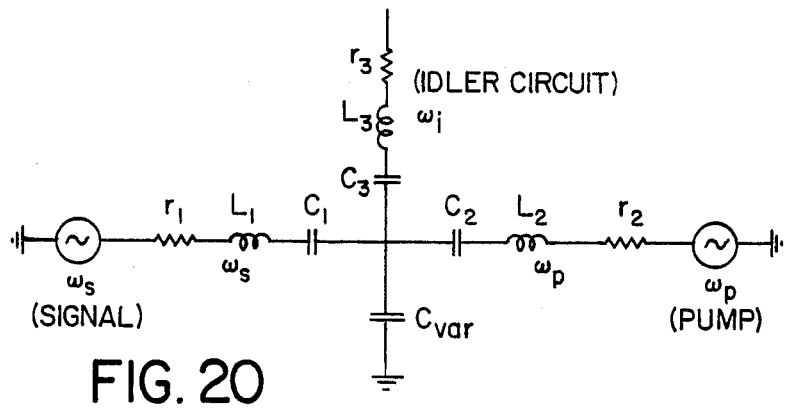
FIG. 20 is a generalized schematic diagram of a parametric amplifier.

The superheterodyne FM radio receiver functions as a parametric amplifier for the input RF signal. To illustrate this, a basic parametric amplifier is shown schematically in FIG. 20. In the figure, three series resonance circuits are tied to varactor diode, of which the capacitance is a non-linear function of the applied voltage. Each of the three resonance networks present a low-impedance path to the varactor diode at its resonance frequency. The conventional nomenclature is that of "pump", "signal", and "idler" whose resonance frequencies are $\omega_p$, $\omega_s$ and $\omega_i$ respectively. The resonance frequencies are related as $\omega_i = \omega_p - \omega_s$. The large pump signal drives the non-linear junction capacitance at its pump frequency, $\omega_p$. The small signal and the large pump current mix in the non-linear varactor to produce voltages at many frequencies. Only the frequency component at the idler (difference) frequency is allowed to flow as a substantial current through the varactor. The idler current and the pump current remix and produce a signal component at the signal frequency, which is expressed as $(\omega_p - \omega_i) = \omega_p - (\omega_p - \omega_s) = \omega_s$. Reinforcement of the original signal component occurs. This action can also be viewed as essentially creating a negative resistance in the signal resonance network. Parametric amplifiers are used primarily for low noise amplification in the microwave frequency regions. However with the negative admittance networks, this principle has been extended to much lower frequencies.

Figure 21:
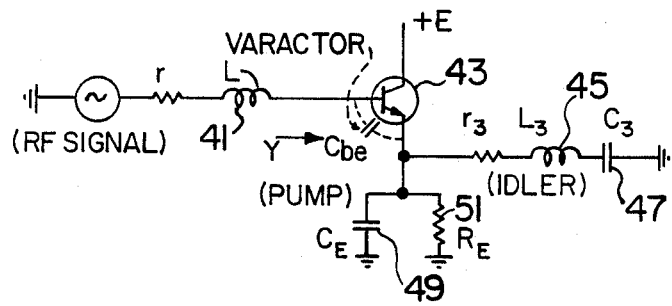
FIG. 21 illustrates the parametric amplifier action of module 1.

FIG. 21 shows the input RF stage of the superheterodyne receiver. While the actual implementation appears quite different from that of FIG. 20, for instance only one resonance network is used for both the "pump" and the "signal", clear analogies are easily made and will be explained below. The "pump" is the oscillating signal in the input resonance network, due to the negative admittance. The "signal" is introduced by induction in the resonance tank coil 41 from a remote transmitter. The "idler" is on the emitter side of the transistor 43 comprising an inductor 45 and a capacitor 47. The base-emitter junction capacitance $C_{be}$ (shown in dotted line) of the transistor 43 plays the role of the varactor-diode $C_{var}$ of FIG. 20. The "signal" and the "pump" mix and due to the non-linear behaviour of the negative admittance network produce additional frequency components. The signal produced of interest is the one at the difference frequency, the "idler" signal (IF signal). The idler resonance network essentially shorts the phase shift network having a trimmer capacitor 49 and a resistor 51; therefore the "idler" operates directly over the base-emitter resistance $r_e$, in parallel with the base-emitter junction capacitance $C_{be}$.

Both $r_e$ and $C_{be}$ are non-linear with respect to the voltage applied over them, in this case from the "idler".

$C_{be}$ and $r_e$, contain therefore a component varying at the frequency of the "idler", $C_{be}(\omega_i)$ and $r_e(\omega_i)$. $R_{eq}$ and $C_{eq}$ are functions at $r_e$ and $C_{be}$, hence $R_{eq}(\omega_i)$ and $C_{eq}(\omega_i)$ indicate the parametric modulation of the admittance Y at $\omega_i$.

The "large" oscillating signal (="pump") at $\omega_p$ is developed over this admittance Y. Re-mixing occurs and a signal component at $\omega_s$ is develoed, as in the case of parametric amplifier discussed above.

This newly created signal at $\omega_s$ re-enforces the original signal at $\omega_s$, i.e. amplification occurs of the induced RF input signal.

IF amplifier

Referring to FIG. 17, when the RF signal is mixed with the local oscillator signal at the transistor 43, because of the non-linear behaviour of the negative admittance network, a beat frequency (IF) is produced. A series resonance network consisting of a coil 45 and a trimmer capacitor 47 at the emitter side of the of the transistor 43, is attuned to the IF frequency. The IF signal is passed through the transistor 53 and is fed to IF parallel resonance network made up with a coil 55 and the total inherent circuit capacitance. At the IF frequency, a very small IF-impedance is present on the emitter side (series resonance) and a large IF impedance is present at the collector side (parallel resonance) of transistor 43.

Since the voltage gain is proportional to the ratio of the collector to emitter impedance it is obvious that gain at the IF-frequency can readily be obtained.

The transistor 53 has two functions:

(1) It decouples the IF parallel resonance circuit from the RF-transistor 43, allowing larger IF-gains to be obtained without oscillatory instabilities.
(2) It completes the frequency-feedback-loop which will be discussed below.

Homodyne output stage (module 2)

The remaining part (module 2) of the FM receiver shown in FIG. 17 forms basically an IF homodyne receiver which has been described above in detail. The IF transistor 57 makes up another three-terminal negative admittance network together with an IF phase-shift capacitor 59 and an IF phase-shift resistor 61. The frequency demodulated output signal is produced at terminal 67, over resistor 63 and capacitor 65.

Frequency-feedback-loop

In FIG. 17 coil 55 is actually common to both module 1 and module 2. The output at the terminal 67 is fed back through the transistor 53 to control the frequency of the RF local oscillator. In conventional FM superheterodyne receivers, there is some limited form of feedback which is restricted to DC operation and is usually called automatic frequency control (AFC). Its role is to stabilize the frequency of the local oscillator. In the present embodiment, the feedback is dynamic.

The transistor 53 is an essential "pivot point" between the two modules, handling simultaneously and independently the information flow between these two modules. In the forward direction, transistor 53 transmits the IF signal to the following module and at the same time decouples the amplified IF signal from the input module. In the reverse direction, transistor 53 takes the demodulated FM output and feeds it back to the input module where it controls the frequency of the RF oscillator. The transistor 53 operates as a unity gain voltage follower imposing the output signal on the collector of transistor 43 and therefore controlling, via the base-collector junction capacitor $C_{bc}$ of the transistor 43, the frequency of the RF oscillator.

The essential operations of the FM receiver, with regard to frequency feedback are illustrated in FIG. 22. The basic action of module 1 is to down convert the RF frequency to an intermediate frequency. Module 2 can here be simple considered as a voltage-to-frequency converter. Its output, via the feedback loop, controls the frequency of the RF-oscillator.

The loop will slave the local oscillator frequency at a constant offset (IF frequency) to the RF-frequency. This is comparable to conventional automatic-frequency-control.

However all baseband signals frequencies are fed back. This has an important effect of the IF signal bandwidth. Indicating variations in the frequencies by the symbol f, the following relations follow from inspection of FIG. 22.

$$f_{if} = f_{LO} - f_{rf}$$

$$V_0 = -\alpha f_{if}$$

$$f_{LO} = \beta V_0$$

where $v_0$ is the output voltage and $\alpha$ and $\beta$ are conversion gain factors of module 1 and module 2.

Combining these relations, one can readily derive for the overall frequency-to-voltage conversion, $$\frac{V_o}{f_{rf}} = \frac{\alpha}{1 + \alpha\beta}$$

and for the frequency deviation compression ratio:

$$\frac{f_{rf}}{f_{if}} = 1 + \alpha\beta$$

Assuming some typical values for $\alpha$ and $\beta$, 1 volt/kHz and 1 MHz/volt respectively, one obtains $$\frac{V_o}{f_{rf}} = 1 \text{ Volt/MHz and } \frac{f_{rf}}{f_{if}} \simeq 1000$$

Consequently a 100 kHz deviation of the RF frequency produces only a 100 Hz deviation of the IF frequency and an output voltage change of 100 mV.

It is obvious that, contrary to conventional FM receivers, a substantial signal bandwidth compression takes place from RF to IF. The IF stage therefore has to pass only the modulation frequencies and not the large associated frequency deviations inherent in the frequency modulation process.

Brief description of two-terminal negative admittance networks

The admittance Y of the network shown in FIGS. 23 and 24, looking into terminals 69 and 71 or terminals 73 and 75 is $$Y = i/V = G + jB$$

where Y is complex having G (conductance) the real part and B (susceptance the imaginary part. FIGS. 23 and 24 show the preferred embodiments for RF and IF frequencies respectively. The admittance is taken to be negative when the real part G is negative. The input voltatge is v and the input current is i for both networks of the figures. The admittance is non-linear when either G or B or both are a function of the input current i or the input voltage v.

The negative real part (negative conductance) G of the admittance is created by various mechanisms:
 (a) at low operating frequencies, a parallel-voltage series-current positive feedback action creates a negative conductance G.

For medium and higher operating frequencies other mechanism rapidly overtake the feedback action, i.e.
 (b) the active devices, such as the transistors in the networks, become increasingly complex due to their small internal capacitances and dynamic impedances
 (c) the lower effective impedance of $R_s$ and $C_s$ in parallel (shown in FIGS. 23 and 24) towards higher frequencies.
 (d) transit diffusion delay across base regions of the transistors.

These effects (b), (c) and (d) are essential in producing a negative conductance for higher operating frequencies. The negative admittance is non-linear. This is caused primarily by the non-linearity in the emitter resistance $r_e$ and base emitter capacitance $C_{be}$ of the bipolar transistors and the non-linearity in the gate source capacitance $C_{gs}$ and the transconductance of the field-effect transistors shown in FIG. 25(a) to (d). These non-linearities are very essential in the operations of the FM receivers.

Figure 26:
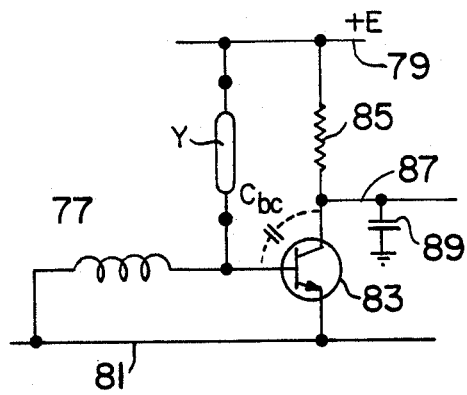
FIG. 26 is an embodiment of a FM homodyne receiver using a two-terminal negative admittance.

The FIG. 26 is shown a homodyne FM receiver. A two-terminal negative admittance Y is connected in series with coil 77 between the power supply 79 and the groudplane 81. A bipolar transistor 83 is connected at midpoint and is fed by the power supply 79 through a resistor 85. When the frequency of the induced frequency modulated RF signal is close to or equal to the local oscillator frequency a FM demodulated output signal is produced at the collector 87. Capacitor 89 with resistor 85 from a low-pass filter determining the bandwidth of the demodulated FM signal. The interelectrode capacitance $C_{bc}$ of the bipolar transistor 83 is part of a frequency feedback loop. The homodyne reciever, shown in FIG. 26 performs, unlike conventional receivers, with only one simple circuit all the functions required for a FM receiver, such as antenna, RF amplifier, local oscillator, mixer, limiter, synchronous FM discriminator, automatic frequency control and audio amplifier.

Figure 27:
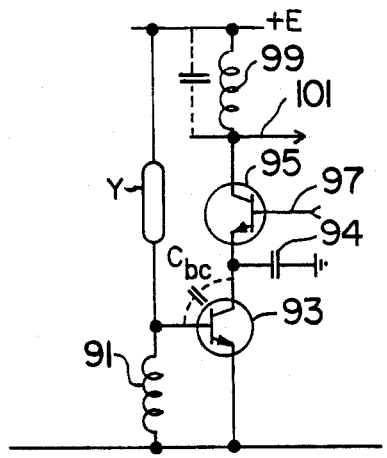
FIG. 27 is a frequency converter using a two-terminal negative admittance network.

Turning now to FIG. 27, a frequency down converter amplifier is shown. An RF signal is induced in a coil 91. The two-terminal negative admittance network oscillates at a local oscillator frequency and produces an IF signal when the RF signal and the local oscillator signal are mixed at the input of the bipolar transistor 93. Another bipolar transistor 95 is provided to decouple the amplified IF signal from transistor 93. Moreover it is also part of a frequency feedback loop in the superheterodyne receiver configurations where the frequency demodulated output signal is fed back to terminal 97. Capacitor 94 bypasses the RF signals at the collector of transistor 93. A coil 99 is resonating at the IF frequency and the IF output 101 is now presented to a homodyne type receiver operating at the much lower frequency IF instead of RF. The IF operation allows a much higher gain to be achieved in the frequency-feedback-loop, resulting in an increased receiver sensitivity.

More detailed discussion on the frequency down converter and various types of FM receivers, such as homodyne and superheterodyne FM receivers using two-terminal negative admittance networks can be found in the above references applicant's co-pending application.

Other preferred embodiments of the present invention

As seen in FIG. 17, a superheterodyne FM receiver is made of two three-terminal negative admittance networks (module 1 and module 2) coupled to each other with a transistor 53.

As mentioned earlier in the present disclosure, it is also possible to use the two-terminal negative admittance network to form FM homodyne and superheterodyne receivers. The previously identified applicant's co-pending application, Ser. No. 06/851,552, describes such receivers.

Consequently the following superheterodyne FM receivers are logical conclusions.

Figure 28:
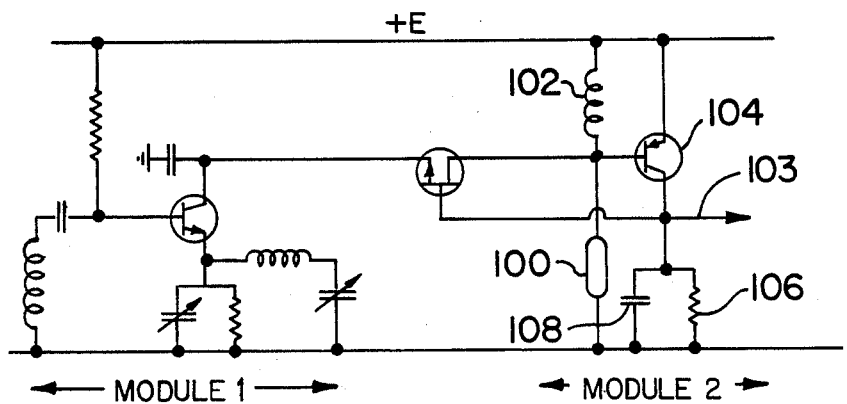
FIGS. 28, 29 and 30 show circuit diagrams of FM superheterodyne receivers according to other aspects of the present invention.

FIG. 28 uses a three-terminal negative admittance network having a first, a second and a third terminal in module 1 and a two-terminal negative admittance network 100 having a fourth and a fifth terminal in module 2. Module 2 forms an IF homodyne circuit and produce a demodulated FM output at a terminal 103. In particular, module 1 is identical to module of FIG. 17 except for the biasing scheme. The decoupling transistor is also provided between module 1 and module 2. In module 2, a two-terminal negative admittance network 100 and an IF transistor 104 is arranged to function as an IF homodyne circuit similar to the RF homodyne shown in FIG. 26. An IF coil 102 and the two-terminal negative admittance network 100 are connected in series. The IF transistor 104 is an PNP type and therefore the IF coil 102 and the network 100 are connected in reverse order unlike that shown in FIG. 26. A bias resistor 106 and an IF bypass capacitor 108 are connected at the collector of the PNP transistor. The frequency feedback is effected by a connection between the decoupling transistor and the output terminal 103.

Figure 29:
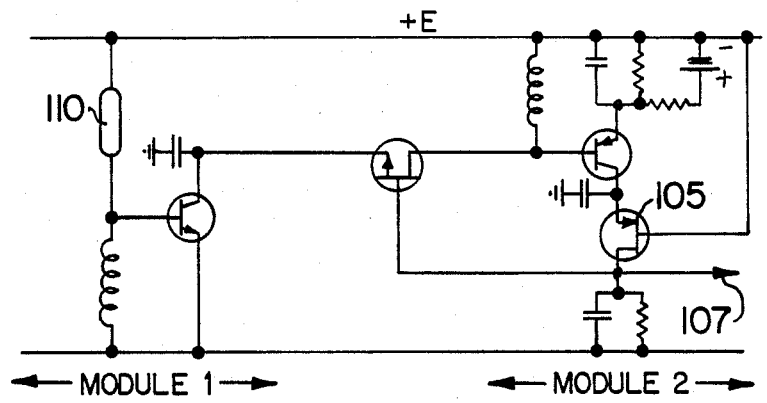

FIG. 29 shows on the other hand a superheterodyne FM receiver in which a two-terminal negative admittance network 110 is used in module 1 and module 2 is made of a three-terminal negative admittance network including a transistor 105. Module 2 of this embodiment is almost identical to the module shown in FIG. 16 with exception that the operating frequency and the type of transistors are different, thus necessitating the reversal of the positions of load resistor, bypass capacitor, phase shift means etc.

Figure 30:
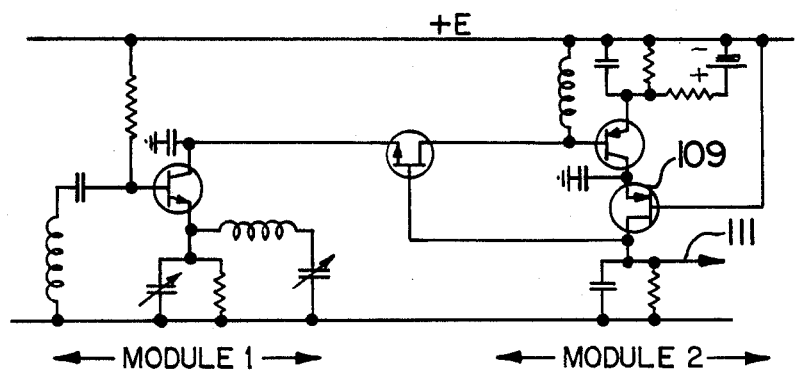

FIG. 30 indicates another embodiment of superheterodyne FM receiver wherein, as in FIG. 17, two-three terminal negative admittance networks are employed. The figure includes an additional transistor 109 at the demodulated output terminal 111. Also included in FIG. 30 is the actual biasing of the negative admittance networks. The transistor 109 decouples the IF signal from the demodulated signal. As in the previous figure, this decoupling transistor also stabilizes the operation of negative frequency feedback.

It is noted that in FIGS. 17, 28, 29 and 30, the transistor coupling the two modules is shown as in FET but of course, a bipolar junction transistor can be used. It is also possible to replace transistors 105 (FIG. 29) and 109 (FIG. 30) with a bipolar junction transistor.

I claim:

1. An FM receiver having a frequency converter, wherein the said frequency converter comprising:
   a three terminal electrical network which has a first, a second and a third terminal and which exhibits a negative admittance to a high frequency input signal applied between the first and the third terminal.
   the said three-terminal electrical network further including
      an RF transistor having a first, a second and a third electrode,
      the first electrode connected to the first terminal,
      the second electrode connected to the second terminal,
      phase shift means comprising a phase shift resistor and a phase shift capacitor and bridging the third electrode and the third terminal for phase shifting the current and the voltage of the high frequency input signal with respect to each other, and
      the said resistor and capacitor being chosen as to their values to phase-shift the said current and the said voltage more than 90° out of phase with respect to each other,
   a resonance structure, in which an RF signal is induced, being connected between the first and the third terminal to supply the said high frequency input signal to the first terminal,
   a series IF resonance circuit connected between the third electrode and the third terminal, a decoupling transistor and an RF bypass capacitor provided at the second terminal, a parallel IF resonance circuit connected at its one end to the decoupling transistor and at the other end to one of the polarities of a power supply, an output connected to the decoupling transistor to provide an output IF signal whose frequency is the resonant frequency of the said series and parallel IF resonance circuits.

2. The FM receiver according to claim 1 wherein the decoupling transistor has an electrode to which a frequency feedback signal can be applied.

3. The FM receiver according to claim 2 further comprising biasing means consisting of a biasing resistor connected between the first electrode of the transistor and one of the polarities of the power supply, a DC-blocking capacitor connected between the first terminal of the three-terminal negative admittance network and the first electrode of the transistor.

4. The FM receiver according to claim 3, further comprising:

a second three-terminal electrical network having a fourth, a fifth and a sixth terminal and exhibiting a negative admittance to the IF signal applied between the fourth and sixth terminal, the second three-terminal electrical network further including an IF transistor having a first, a second and a third electrode, the first electrode of the IF transistor, connected to the fourth terminal, the second electrode of the IF transistor, connected to the fifth terminal, IF phase shift means comprising an IF phase shift resistor and an IF shift capacitor and bridging the third electrode of the IF transistor and the sixth terminal for phasing shifting the current and the voltage of the IF signal with respect to each other, and the said IF phase shift resistor and IF phase shift capacitor being chosen as to their values to phase shift the said current and the said voltage of the IF signal more than 90° out of phase with respect to each other, the fourth terminal connected to the output of the frequency converter, a load resistor connected to its one end to the fifth terminal and at the other end to one of the polarities of a power supply, a bypass capacitor connected to the fifth terminal for bypassing the IF signal, the said load resistor and bypass capacitor forming a low pass filter for the demodulated FM signal, and an output terminal connected to the fifth terminal to provide a demodulated FM signal.

5. The FM receiver according to claim 4, further comprising:

frequency feedback means provided between the output terminal and the decoupling transistor of the frequency converter.

6. The FM receiver according to claim 5, further comprising:

an IF stabilizing transistor and an IF stabilizing bypass capacitor inserted between the fifth terminal and the output terminal.

7. The FM receiver according to claim 3 further comprising:

a two-terminal negative admittance network having a fourth and a fifth terminal and exhibiting a negative admittance to the IF signal applied between the fourth and the fifth terminal, the fourth terminal connected to the output terminal of the frequency converter, the fifth terminal connected to the third terminal, an IF transistor being connected to the fourth terminal, a resistor and capacitor connected, parallel, between said IF transistor and the fifth terminal, and an output terminal connected to said IF transistor to provide a demodulated FM signal.

8. The FM receiver according to claim 7, further comprising:

frequency feedback means provided between the output terminal and the decoupling transistor of the frequency converter.

* * * * *